United States Patent [19]

Bordina et al.

[11] 3,948,682

[45] Apr. 6, 1976

[54] SEMICONDUCTOR PHOTOELECTRIC GENERATOR

[76] Inventors: Ninel Mineevna Bordina, Bolshaya Cherkizovskaya ulitsa, 8, korpus 7, kv. 171; Vitaly Viktorovich Zadde, poselok Severny, 9, linia, 3, kv. 120; Aita Konstantinovna Zaitseva, ulitsa Verkhnyaya, 3, kv. 5; Arkady Pavlovich Landsman, Rizhsky proezd, 3, kv. 140; Dmitry Semenovich Strebkov, Kirovogradsky proezd, 3, korpus 1, kv. 17; Valentina Ivanovna Streltsova, Zarevy proezd, 5, korpus 3, kv. 318; Vadim Alexeevich Unishkov, ulitsa Bazhova, 15, korpus 1, kv. 142, all of Moscow, U.S.S.R.

[22] Filed: Oct. 31, 1974

[21] Appl. No.: 519,697

[52] U.S. Cl. ............... 136/89; 29/572; 148/1.5; 156/17; 357/15; 357/20; 357/30; 357/40; 357/47
[51] Int. Cl.² .................. H01L 31/06; H01L 31/18
[58] Field of Search ............ 136/89; 357/20, 30, 15

[56] References Cited
UNITED STATES PATENTS

| | | | |
|---|---|---|---|
| 3,370,986 | 2/1968 | Amsterdam et al. | 136/89 |
| 3,422,527 | 1/1969 | Gault | 29/572 |
| 3,460,240 | 8/1969 | Tarneja et al. | 136/89 X |
| 3,462,311 | 8/1969 | Ross | 136/89 |
| 3,513,040 | 5/1970 | Kave et al. | 136/89 X |
| 3,546,542 | 12/1970 | Riel et al. | 136/89 X |
| 3,620,829 | 11/1971 | Beck | 136/89 X |
| 3,653,971 | 4/1972 | Lidorenko et al. | 136/89 |
| 3,682,708 | 8/1972 | Bennett | 136/89 |
| 3,690,953 | 9/1972 | Wise | 136/89 |
| 3,713,893 | 1/1973 | Shirland | 136/89 |
| 3,760,240 | 9/1973 | Bergt | 136/89 X |

*Primary Examiner*—T. Tung
*Assistant Examiner*—Aaron Weisstuch
*Attorney, Agent, or Firm*—Haseltine, Lake & Waters

[57] ABSTRACT

A semiconductor photoelectric generator comprising interconnected photocells with rectifying barriers, with isotype junctions in the base region and with current leads in the regions adjacent the rectifying barriers. Each photocell has a working surface, receiving incident radiation. The isotype junctions in the photocells are provided in direct proximity to the working surfaces of the photocells. At least one rectifying barrier in each photocell is provided at a distance from the working surface not exceeding the diffusion length of minority current carriers in the base region. The photocells can have the shape of microminiature parallelepipeds having at least two dimensions commensurate with the diffusion length of minority current carriers in the base region.

8 Claims, 12 Drawing Figures

SEMICONDUCTOR PHOTOELECTRIC GENERATOR

The present invention relates to devices for converting radiant energy into electric energy, and more specifically to semiconductor photoelectric generators.

Known in the art are photoelectric generators comprising photocells with rectifying barriers, in particular, p-n junctions, and isotype p-p$^+$ (n-n$^+$) junctions in the base region, metal current leads to the regions adjacent to rectifier barriers, in this case to the base and doped regions. The p-n junction is disposed adjacent or in direct proximity to the working surface receiving incident radiation.

An isotype p-p$^+$(n-n$^+$) junction is disposed in the base region of the generator adjacent to the surface which is opposite to the working surface.

Such generators have only one working surface and exhibit a comparatively large value of spreading resistance in the thin doped layer separated from the base region by a p-n junction, which feature tends to reduce the efficiency as the intensity of illumination grows higher than 0.5 Wt/cm$^2$. In addition to that, the spectral sensitivity of such generators is reduced when the p-n junction is disposed deeper than 1 micron. With reduced p-n junction depth, the spreading resistance in the doped layer and the leakage current through the p-n junction tend to increase, owing to the negative action of surface effects stemming from the disturbed structure of the semiconductor surface, as well as to the surface recombination of minority current carriers.

Known in the prior art are semiconductor photoelectric generators embodied as solid-state matrices of microminiature photocells with p-n junctions.

The above-mentioned photocells have the form of microminiature parallelepipeds made up into a solid state matrix by means of metal current leads disposed over the whole surface of the parallelepiped face which is inclined at a certain angle to the working surface of the generator, which is adapted to receive incident radiation. The p-n junction planes are located on one, two, three, four, or five parallelepiped faces and the width of each microminiature parallelepiped is approximately equal to the diffusion length of minority current carriers in the base region.

The above-described generators suffer heavy current losses owing to the current carriers recombination on the surface of the p-n junction-free faces of microminiature photocells.

The presence of spread resistance in the doped region located in direct proximity to the working surface and separated from the base region by a p-n junction results in decreased efficiency of such generators when the illumination exceeds 50 Wt/cm$^2$.

In addition to that, known generators in the form of solid state matrices exhibit increased leakage current through the p-n junction, resulting from a relatively large surface area occupied by the p-n junctions and from losses due to the face effects at the end faces at the points where the p-n junctions extend to the surface.

It is an object of the present invention to provide a semiconductor photoelectric generator having a high efficiency when illuminated from the base region side.

Another object of the present invention is to increase current and voltage sensitivity of the generator.

Still another object of the present invention is to reduce to zero the spread resistance in the thin doped layer and to produce a higher efficiency generator, as compared to known generators, at high concentration of luminous flux, in the order of 250 Wt/cm$^2$, and higher.

These and other objects of the present invention are achieved in a semiconductor photoelectric generator comprising a circuit of photocells with rectifying barriers, isotype junctions in the base region and current leads to the regions adjacent to the rectifying barriers, each photocell having a working surface to be struck by the incident radiation, wherein, according to the invention the isotype p-p$^+$(n-n$^+$) junctions are provided in direct proximity to the working surfaces of the photocells, and the rectifying barriers are spaced from the working surface at a distance not exceeding the diffusion length of minority current carriers in the base region.

The problem of reducing the generator series resistance and increasing the light source radiation intensity at which the linear increase of generator current and output is retained can also be solved by providing in each photocell a rectifying barrier disposed parallel to the surface that is opposite to the working surface, over the whole area thereof, while the current leads are disposed on the working surface and on the surface that is opposite to the working surface.

The task of further improving the generator efficiency and the current sensitivity thereof, including that at high concentration of the light flux in the order of 250 Wt/cm$^2$ and higher can be solved by that each photocell connected into a solid state matrix having the form of a microminiature parallelepiped, at least two linear dimensions thereof being commensurate with the diffusion length of the minority current carriers in the base region, is provided, according to the invention, with at least one additional isotype p-p$^+$(n-n$^+$) junction, disposed parallel to the face which is inclined at a certain angle to the working surface and free of a rectifier barrier.

In order to increase the generator efficiency, it is expedient to provide each semiconductor photocell, wherein the rectifying barrier and the metal lead are arranged in parallel with at least one of the faces inclined at a certain angle to the working surface of the generator which receives incident radiation, with an additional isotype p-p$^+$(n-n$^+$) junction disposed on the surface that is opposite to the working surface.

In order to reduce to zero the spreading resistance in the thin layer separated from the base region by a rectifying barrier, it is expedient to provide in each photocell which has the shape of a microminiature parallelepiped having at least two linear dimensions that are commensurate with the diffusion length of minority current carriers in the base region and connected to form a solid state matrix, according to the invention, a rectifying barrier disposed on the surface that is opposite to the working surface, arranged over the entire area thereof and dispose current leads on the working surface and on the surface that is opposite to the working surface.

In order to improve the generator voltage sensitivity and increase its efficiency, it is also expedient to provide a p-n junction as a rectifying barrier and dispose it at a depth sufficient to remove the action of surface effects thereon.

In order to increase the generator current output it is also expedient to provide in each photocell at least one additional isotype junction disposed parallel to the surfaces that are opposite to the working surface, to provide current leads to the base regions over the entire area of said surfaces and dispose the rectifying barriers in parallel with the faces that are inclined at a certain angle to the working surface.

A semiconductor photoelectric generator embodied according to the present invention exhibits the following advantages: The generator features a high efficiency when illuminated from the base region side, high current and voltage sensitivity, low value of series resistance, which permit the illumination range wherein the linear dependence of current and power on the illumination is retained to be increased.

Other objects and advantages of the present invention will become apparent to those skilled in the art from the following detailed description of embodiments thereof taken in conjunction with the accompanying drawings, wherein.

The present invention is exemplified by various modifications of the generator having a p-n junction (rectifying barrier), however it is specifically emphasized herein that in the embodiments described a Schottky barrier can be used instead of the p-n junction, the choice of either one of the rectifying barriers being governed by the following consideration: the use of a Schottky barrier will simplify the manufacturing technology, whereas a p-n junction will ensure a higher conversion efficiency.

Figure 1:
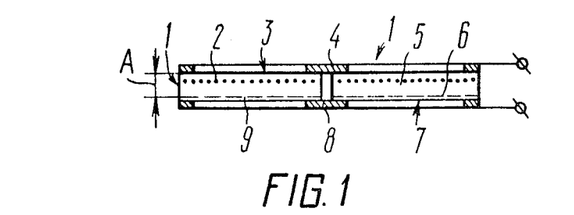
FIG. 1 illustrates in cross-sectional view a generator made up of connected photocells with an isotype p-p$^+$(n-n$^+$) junction disposed on the working surface, according to the invention.

A semiconductor photoelectric generator comprising interconnected photocells is illustrated in FIG. 1. Each photocell 1 in the generator is provided with an isotype p-p$^+$(n-n$^+$) junction 2, disposed in direct proximity to the working surface 3 which receives incident radiation, a current lead 4 to the base region 5, a p-n junction 6, disposed in direct proximity to the surface 7 which is opposite to the working surface, a current lead 8 to the doped region 9. The distance A from the working surface 3 to the p-n junction 6 does not exceed the diffusion length of minority current carriers in the base region 5, which is approximately equal to the thickness of photocells 1.

The current leads 4 and 8 to the doped regions 5 and 9 respectively are made in the form of nets and are aligned in plane.

The iostype p-p$^+$(n-n$^+$) junction 2 is created by diffusion (or ion doping) methods and has a low concentration of recombination centres, a sufficiently high potential barrier and adequate width of space charge region, so that almost all minority charges when approaching the working surface 3 are rejected from the latter.

The rate S of surface recombination on the working surface is related to the reflectance R of minority carriers from the working surface as follows:

$$S = \frac{\overline{c}}{2} \cdot \frac{1-R}{1+R} \quad (1)$$

wherein $\overline{C}$ is mean thermal velocity of minority current carriers.

Since $(1-R)$ is the recombination probability of minority current carriers when approaching the surface, the value is the effective surface area of the trap per unit of surface area.

The generator design makes use of isotype junctions 2 characterized by a high value of reflectance R, low probability of recombination when minority current carriers approach the surface, and low effective surface area of the trap per unit of surface area $(1-R)$, which, in accordance with the formula (1) permits the rate of recombination on the working surface 3 of the base region 5 of minority current carriers generated in the bulk of the base region 5 to be reduced to zero. For this reason the design of the generator shown in FIG. 1 permits a high output to be obtained when the generator is illuminated from the side of the base region 5.

The depth of isotype junction 2 is several times smaller than the permissible minimum depth of the p-n junction 6, being about 1000 A, with the result that the spectal sensitivity of the generator in the short-wave region, as compared to the prior art generators, is increased.

The generator features a high efficiency both when illuminated from the side of the working surface 3, and when simultaneously illuminated from the side of surfaces 3 and 7.

Therefore, the output and efficiency of the generator when operating, for example, as a component of a solar battery in a cosmic apparatus orbiting the Earth at a low height are increased about 40 percent due to both the direct solar radiation and that reflected from the Earth being used simultaneously.

Figure 2:
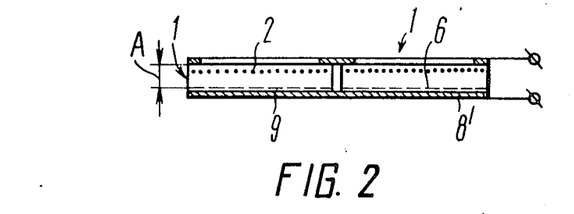
FIG. 2 illustrates in cross-sectional view a generator made up of connected photocells with an isotype p-p$^+$(n-n$^+$) junction on the working surface, wherein the p-n junction and the current lead to the doped region are disposed in parallel with the surface that is opposite to the working surface, according to the invention.

According to FIG. 2, each photocell 1 with an isotype $p$-$p^+$($n$-$n^+$) junction 2, which is a component of the generator, has a solid metal current lead 8' to the whole of the doped region 9. As the material of the current lead 8', use is made of metals having high electric conductivity, specifically silver in this case.

A higher efficiency of energy conversion in such a generator is insured by reducing to zero the spreading resistance in the doped region 9, separated from the base region 5 by a p-n junction 6 which is parallel to the surface 7 which is opposite to the working surface. Therefore the range of illumination of the generator, at which the linear dependence of current and power from the intensity of the light flux is retained, is increased.

Increased depth of the p-n junction 6 from the surface 7 at a distance of the order of 10 microns results in an additional increase of the generator efficiency, according to FIG. 2, since the shaping of a p-n junction at a greater depth from the semiconductor surface eliminates the action of surface effects and reduces the leakage current through the p-n junction 6.

Figure 3:
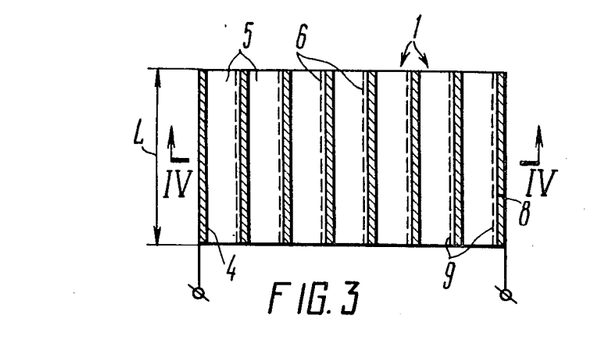
FIG. 3 illustrates in longitudinal section a generator in the form of a matrix made up of microminiature photocells whose iostype p-p$^+$(n-n$^+$) junction is disposed on the working surface, according to the invention.
Figure 4:
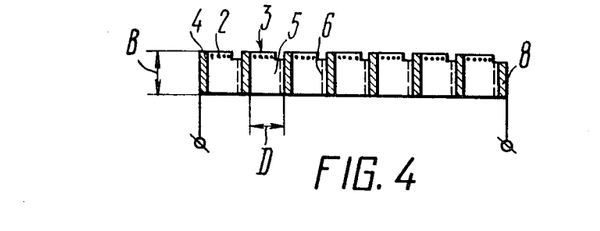
FIG. 4 is a cross-sectional view of the generator shown in FIG. 3, taken along line IV–IV.

FIGS. 3 and 4 illustrate a semiconductor photoelectric generator in two projections, the generator being a matrix of semiconductor photocells 1. The photocells 1 are embodied as microminiature parallelepipeds whose width D is approximately equal to the diffusion length of minority current carriers in the base region 5 (FIG. 4).

Each photocell 1 comprises a current lead 4 to the base region 5, a p-n junction 6 and a current lead 8 to the whole doped region 9, disposed parallel to the faces of the parallelepiped which are square to the working surface 3 (FIG. 4). An isotype $p$-$p^+$($n$-$n^+$) junction 2 is disposed in direct proximity to the working surface 3 (FIG. 4).

The most typical dimensions of photocells in a silicon matrix are as follows: width of doped region 9 from 0.5 to 10 microns; width of base region 5, from 90 to 400 microns; the matrix thickness B is from 0.1 to 10 mm; the length L of the microminiature parallelpiped is from 0.2 to 40 mm; the width of the current leads 4 and 8 is from 3 to 20 microns. The material used for the current leads 4 and 8 reduces to zero the spreading resistance in the doped region 9. The depth of the isotype $p$-$p^+$($n$-$n^+$) junction 2 from the working surface 3 is about 1000 A.

The distance between any point of the p-n junction 6 to the working surface 3 of the generator is within the diffusion length of minority current carriers in the base region 5, which ensures complete collection of minority current carriers moving from the working surface 3 to the p-n junction 6. The generators embodied according to FIGS. 3 and 4, permit the recombination of current carriers on the surface 3 to be reduced to zero and increase the generator efficiency. Moreover, due to the absence of power losses for spreading resistance in the doped regions 9, a high value of generator efficiency can be retained at high concentrations of the light flux to produce an output from one square cm of the working surface 3 which is higher than 10 Wt.

Figure 5:
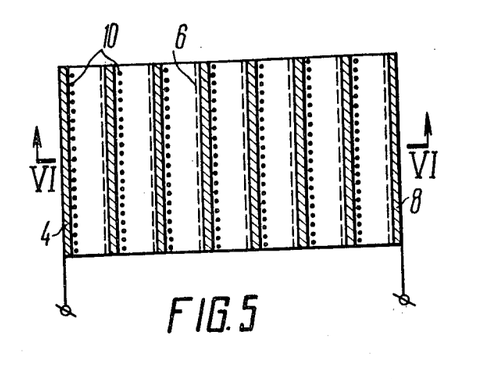
FIG. 5 is a longitudinal sectional view of a generator in the form of a photocell matrix, the photocells having an additional isotype p-p$^+$(n-n$^+$) junction disposed in parallel with the face that is inclined at a certain angle to the working surface, according to the invention.
Figure 6:
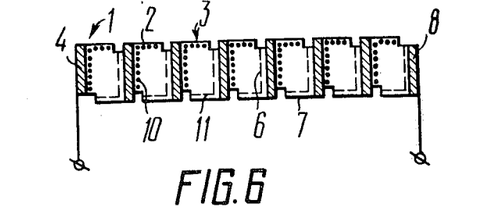
FIG. 6 is in cross-sectional view the generator illustrated in FIG. 5 taken along line VI–VI.

In accordance with FIGS. 5 and 6, wherein illustrated is a semiconductor generator in two projections, each photocell 1, being a solid state component of the generator matrix, has in addition to the main isotype $p$-$p^+$($n$-$n^+$) junction 2, an additional isotype $p$-$p^+$($n$-$n^+$) junction 10 disposed parallel to the lateral face of the parallelepiped, which is free of a p-n junction, and square to the working surface 3 (FIG. 6). In addition to the main p-n junction 6, each photocell 1 is provided with an additional p-n junction 11, disposed in direct proximity to the surface 7 which is opposite the working surface.

A higher current output in this generator is obtained due to the fact that owing to microminiature dimensions of the photocells 1 and the absence of current carrier recombination from the bulk on the two surfaces of the base region, the minority current carriers generated in the base region can be almost completely collected.

Figure 7:
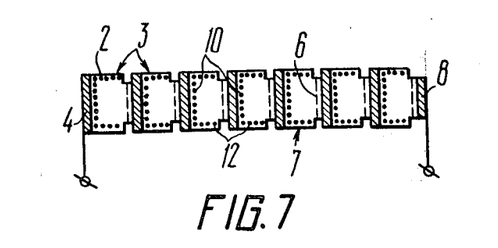
FIG. 7 shows in cross-sectional view a generator in the form of a photocell matrix, the photocells having an additional isotype p-p$^+$(n-n$^+$) junction disposed on the surface that is opposite to the working surface, according to the invention.

In accordance with FIG. 7, each photocell component of the solid state matrix, in addition to having the main isotype $p$-$p^+$($n$-$n^+$) junction 2, and an additional isotype junction 10 disposed perpendicular thereto, has an isotype junction 12, disposed in direct proximity to the surface 7 which is opposite to the working surface 3. The p-n junction 6 is parallel to the face of the parallelepiped, which in turn is perpendicular to the working surface 3.

The isotype $p$-$p^+$($n$-$n^+$) junctions 2, 10 and 12 on three faces of the photocells 1 will increase the generator efficiency and current sensitivity at super-high concentration of luminous flux, inasmuch as absence of power losses on spreading resistance in the doped regions is ensured, together with an almost zero rate of current carriers recombination on the surfaces of the base region 5.

As compared with the generators shown in FIGS. 3 to 6, such a generator features a two-fold increase of its output, provided its surfaces 3 and 7 are equally illuminated.

Figure 8:
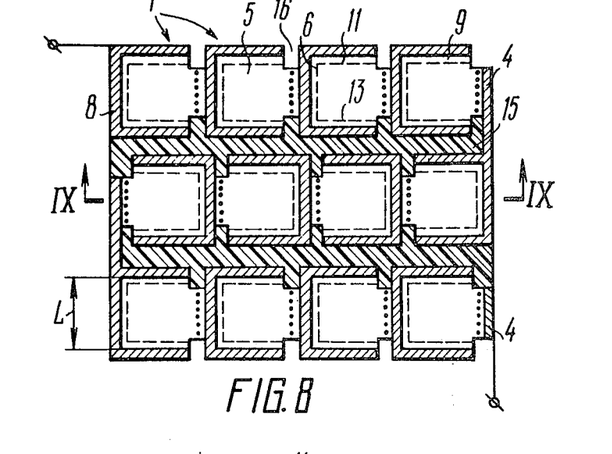
FIG. 8 illustrates in longitudinal section a generator embodied in the form of a monolithic cellular structure wherein one additional isotype p-p$^+$(n-n$^+$) junction is disposed parallel with the faces inclined at a certain angle to the working surface, whereas the other additional isotype p-p$^+$(n-n$^+$) junction is disposed on the surface that is opposite to the working surface, according to the invention.
Figure 9:
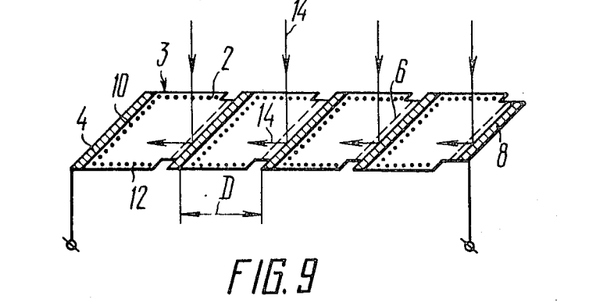
FIG. 9 is a cross-sectional view of the generator illustrated in FIG. 8 taken along line IX–IX.

FIGS. 8 and 9 illustrate two projections of a generator comprising a monolithic cellular structure made up of interconnected photocells 1. The photocells 1 are embodied as microminiature parallelepipeds whose width D and length L are approximately equal to the diffusion length of minority current carriers in the base region 5. The isotype $p$-$p^+$($n$-$n^+$) junctions 2, 10 and 12 are disposed parallel to three faces of the parallelepiped, the planes of one isotype junction 10 being inclined at a certain angle to the working surface 3, whereas the two other $p$-$p^+$($n$-$n^+$) junctions 2 and 12 are parallel to the latter. The p-n junctions 6, 11 and 13 are arranged parallel to three lateral faces of the parallelepiped which are inclined at a certain angle to the working surface 3. The photocells are interconnected in series by means of current leads 4 and 8, disposed on two opposite sides of the parallelepipeds containing a p-n junction and an isotype junction.

The current lead 8 is disposed over the entire area of the surface of the junctions 6, 11 and 13. The current leads 8 and 4 adapted to act as mirror reflectors for the luminous flux 14 which strikes the lateral faces of micorphotocells 1, are inclined at a certain angle to the working surface 3.

The provision of a mirror reflecting contact on the lateral faces of the photocells 1 permits the mirror transmission losses to be reduced owing to increased absorption resulting from the multiple passage of radiation through the photocell 1. Individual sections of the generator are isolated from each other by the insulating layer 15. This embodiment of the generator features higher efficiency at high intensity of the luminous flux as compared with the generator shown in FIGS. 5 and 6, since the spreading resistance of the doped region 9 is zero, the current carriers recombination from the bulk on the surface 3 is reduced to zero, and almost all current carriers generated in the base region 5 are separated by the p-n junctions 6, 11 and 13 and contribute to the photocurrent.

The most typical dimensions of the photocells in the monolythic cellular silicon structure are as follows: the length L of the microminiature parallelepiped is from 0.1 to 1.0 mm; the width D of the microminiature parallelepiped is from 0.1 to 1.0 mm; the thickness B is from 0.2 to 1.0 mm, the width of the insulating layer is from 5 to 15 microns and the width of the current leads is from 3 to 20 microns. The number of photocells per square cm. of the monolithic cellular structure exceeds 100 pieces, the voltage density being more than 40 $V/cm^2$.

Figure 10:
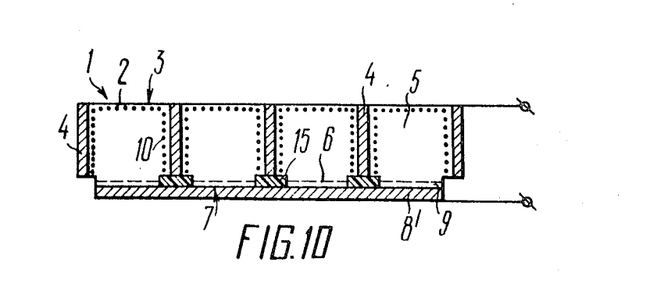
FIG. 10 shows in a cross-sectional view a generator embodied as a monolithic cellular structure wherein the p-n junction together with the current lead to the doped region is disposed over the entire area of the surface which is opposite to the working surface, according to the invention.

FIG. 10 illustrates a generator comprising microphotocells 1 interconnected to form a monolithic cellular structure. In each microphotocell 1, the isotype $p-p^+(n-n^+)$ junctions 2 and 10 are arranged parallel to five out of six faces of the parallelepiped, the planes of four isotype junctions 10 are perpendicular to the working surface 3, and one isotype junction 2 is parallel to the latter. The p-n junction is disposed from the working surface 3 at a distance not exceeding the diffusion length of minority current carriers in the base region 5 and parallel to the face of the generator that is opposite to the working surface. The current leads 4 to the base region 5 are arranged over the entire surface area of the lateral faces which are perpendicular to the working surface 3. The current lead 8' to the doped layer 9 is arranged over the entire area of the p-n junction 6 on the surface 7, which is opposite to the working surface 3. To isolate the doped region 9 from the current lead 4 to the base region 5, a portion of the current lead 4 together with a portion of the isotype junction 10 is etched out and filled with an insulating layer 15.

Such an embodiment of the generator, as compared with the generator illustrated in FIG. 2, permits the spreading resistance in the base region 5 to be decreased and the illumination range, at which linear current and power dependence on the intensity of luminous flux is retained, increased.

Figure 11:
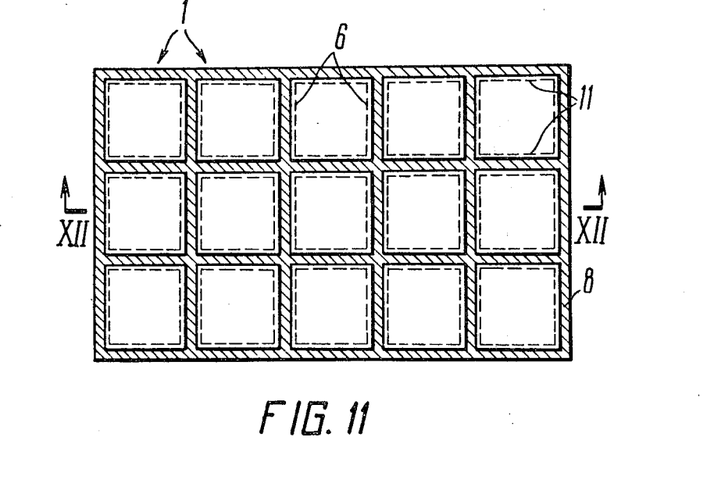
FIG. 11 is a longitudinal section of another embodiment of the generator in the form of a monolythic cellular structure, wherein the additional isotype p-p$^+$(n-n$^+$) junction together with the current lead to the base region is disposed over the entire area of the surface that is opposite to the working surface, according to the invention.
Figure 12:
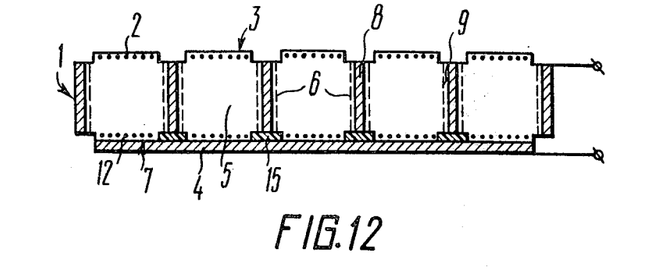
FIG. 12 shows in cross-section the generator illustrated in FIG. 11 taken along line XII–XII.

In accordance with FIGS. 11 and 12, illustrating a generator comprised of photocells 1 interconnected into a monolithic cellular structure, each photocell 1, in addition to the main isotype junction 2 parallel to the working surface 3, has an additional isotype junction 12 arranged parallel to the surface which is opposite to the working surface 3. The p-n junctions 6 are disposed on four lateral faces of the photocells 1, perpendicular to the working surface 3. The photocells are interconnected in parallel with the help of current leads 8, disposed over the entire surface area of the faces with p-n junctions 6.

The current lead 4 to the base regions 5 is disposed over the entire area of the isotype junction 12 on the surface 7, which surface is opposite to the working surface 3.

To isolate the doped region 9 from the current lead 4 to the base region 5, a portion of the latter, together with a portion of the p-n junction 6, had been etched out and filled with an insulating layer 15.

As compared with the generator illustrated in FIG. 10, such arrangement of the p-n junctions 6 and 11 on the four lateral faces permits its current sensitivity to be increased, since almost all minority current carriers generated in the base region are divided on the p-n junctions disposed on four out of six faces of the microphotocells.

The method for manufacturing the semiconductor photoelectric generator is illustrated by way of example made of a silicon generator, according to FIGS. 1, 2, 3, 4, 5, 6, 7, 8, 9, 10, 11, and 12.

In particular, the semiconductor photoelectric generator shown in FIG. 1 is manufactured as follows:

Silicon plates having for example a p-type starting conductivity, are subjected to chemico-mechanical treatment to remove the damaged layer from the surface thereof, then an isotype $p-p^+$ junction 2 is created on the working surface 3 of the plate by implanting a doping agent by the diffusion or ion bombardment method.

In order to obtain an isotype junction having a high, that is almost 100% reflectance R, the concentration of electrically active doping agent on the isotype junction at the working surface must be at least by three orders higher than that in the bulk of the base region, whereas the width of the spatial chargee region must be at least 0.1 micron. For example, if acceptor concentration in the base region of the generator made of a p-type silicon is $10^{16}$ $cm^{116\ 3}$, the acceptor concentration at the working surface after doping is $5\times10^{19}$ $cm^{-3}$, and higher.

A p-n junction is created on the surface 7 which is opposite to the working surface, by means of doping the silicon, using the method of diffusion or ion bombardment.

The depth of the isotype junction 2 at the working surface 3 is from 0.1 to 0.5 micron, whereas the depth of the isotype junction on the surface that is opposite to the working surface is from 0.3 to 30 microns.

Following doping, the plates are subjected to metallization by chemically precipitating nickel, or by vacuum deposition of a multilayer structure comprised of aluminum, iron and silver metals.

The metal current leads 4 and 8 are disposed on both surfaces 3 and 7 of the plate so that they are aligned in plane.

The semiconductor photoelectric generator shown in FIG. 2 is manufactured similarly to the procedure described above, however the plate surface 7 which is opposite to the working surface 3 is metallized over the entire surface area of the p-n junction 6.

The semiconductor photoelectric generator illustrated in FIGS. 3 and 4 is produced by making a stack of metal coated p-type silicon plates with p-n junctions and soldering the plates in the stack together by means of lead or silver foil, the stack being further cut into matrices perpendicularly (or at a certain angle) to the p-n junction plane, the edges of the matrices are further cut off and both surfaces thereof are polished; following polishing, an acceptor doping agent is implanted into the matrix from the side of surface 3 by the ion bombardment or low-temperature diffusion method to provide isotype p-p$^+$ 2 junctions on the working surface 3 of each photocell.

Thereafter the matrices are immersed into a solution of acid to etch out a portion of the doped layer 9 and the current leads 4 and 8 to the photocells 1, the operation resulting in the unshorting of the shunts formed in the process of producing isotype junctions.

The generator illustrated in FIGS. 5 and 6 is produced by making a stack of metal coated silicon plates having a p-n junction 6 and an isotype junction 10 on the opposite sides of each plate, the latter are soldered together in series to make a pile which is thereafter cut into matrices, an additional isotype p-p$^+$ junction 2 being provided on the side of the working surface 3 of the matrix, and an additional p-n junction 11 being provided on the side opposite to the working surface; thereafter the shunts formed in the process of producing additional p-p$^+$ junctions 2 and p-n junctions 11 are deshunted.

The generator illustrated in FIG. 7 is produced by the procedures described for the production of generators shown in FIGS. 5 and 6, the difference being in that after cutting the stack formed by soldered plates having p-n junctions 6 and p-p$^+$ junctions 10 into matrices, additional isotype p-p$^+$ junctions 2 and 12 are provided on both sides of each matrix.

The generator illustrated in FIGS. 8 and 9 is produced by the procedures described for the production of generators shown in FIGS. 5 and 6, however in this case a phosphorus or any other donor impurity is implanted into the solid state matrices formed by interconnected photocells having p-n junctions 6 and p-p$^+$ junctions 10, disposed on the opposite faces of microminiature parallelepipeds and inclined at a certain angle to the matrix surface, the donor impurity being implanted by the ion bombardment or low-temperature diffusion method into both sides 3 and 7 to produce in each photocell additional p-n junctions 11 and 13, whose planes are parallel to the matrix surfaces.

Thereafter the matrices are immersed into an acid solution to etch out a portion of the doped layer and a portion of the current leads 4 and 8 to the photocells 1, the operaton resulting in the unshorting of shunts created in the process of forming additional p-n junctions 11 and 13. After etching out the shunts, the matrices having additional p-n junctions are provided with a mirror reflecting contact 8 which is vacuum deposited at an angle of 15° to 70° to the plane of additional p-n junctions 11 and 13. As a result of the formation of a shadow layer no metal is deposited on the etched out portion 16 of the current lead 4 to the base region 5 and the p-n junctions 11 and 13 with the isotype junction 10 are not shorted.

Thereafter the matrices are cemented together to form a stack in such a manner that the planes of isotype p-p$^+$ junctions 10 of different matrices are parallel, whereas the p-n junctions 6 of adjacent matrices in the stack are of different polarity.

Then the matrices are interconnected in series and cut at a certain angle to the plane of all isotype p-p$^+$ junctions 10 into monolithic cellular structures, which structures are thereafter polished from two sides to remove the damaged layer; thereupon additional isotype p-p$^+$ junctions 2 and 12 are created on both surfaces of the cellular structures by means of low-temperature diffusion or ion bombardment with boron, gallium or any other acceptor impurity.

The generator illustrated in FIG. 10 is produced by soldering together silicon plates having isotype p-p$^+$ junctions 10 on both surfaces thereof into a stack which is then cut into matrices; on both sides of the matrices, additional isotype p-p$^+$ junctions 12 are created by implanting an acceptor impurity by means of low-temperature diffusion or ion bombardment, the matrices being further soldered together into a stack so that the planes of isotype junctions 10 which are perpendicular to the matrix surface are parallel to each other in all the matrices in the stack. The stack is further cut into monolithic cellular structures and on each working surface 3 another additional isotype p-p$^+$ junction 2 is created, whereas on the surface 7 which is opposite to the working surface, a p-n junction 6 is created; further a portion of all current leads 4 to the base region 5 and a portion of isotype junctions 10 are etched out and the etched out areas are filled with an insulating layer 15, and a continuous metal current lead 8 to the doped layer 9 is applied to the whole surface area of the p-n junction 6.

The generator illustrated in FIGS. 11 and 12 is provided by soldering into a stack silicon plates having p-n junctions 6 on both surfaces thereof, the stack is further cut into matrices and on each matrix additional p-n junctions 11 are provided on both sides thereof, the matrices thus produced are soldered together to form a stack so that in different matrices in the stack the planes of p-n junctions 6 perpendicular to the matrix surface are parallel to each other; the stack is thereafter cut into cellular structures and on both sides of the structure, isotype p-p$^+$ junctions 2 and 12 are created, a portion of all current leads 8 to the doped layer and a portion of p-n junctions 6 are etched out on one side and the etched areas are filled with an insulating layer 15 and a continuous metal current lead 4 is applied onto each p-p$^+$ junction 12.

In case a Schottky barrier is selected as the rectifying barrier for the generator, the technology of generator manufacture will depart from that described above in that to create a rectifying barrier the silicon surface is metallized with such metals as platinum, palladium or gold, rather than doping the silicon.

The methods proposed herein permit the production of a generator in the form of individual interconnected photocells a matrix or a monolithic cellular structure made up of microminiature photocells having isotype p-p$^+$ junctions on one, two, three, four and five faces; all the microphotocells in the matrix or monolithic cellular structure are subjected to a complete technological cycle, from the treatment of the surface and implantation of impurities to the deposition of contacts and the parameter control. This considerably simplifies the technology of generators manufacture and increases labour productivity.

The method according to the present invention permits complete automation of matrix assembly from microstructures.

For all types of generators the areas of current leads 8 to the doped region 9 does not exceed 5% of the total area of the working surface.

The continuous current lead 8' on the photocell faces which contain a p-n junction, the presence of an isotype p—p$^+$ junction 2 on the working surface, as well as the microminiature embodiment of photocells permits the series resistance of each photocell in the generator to be reduced at least 20-fold, as compared with the prior art photocells. This insures effective operation of the generators at a light flux intensity exceeding 250 Wt/cm², that is 2500 times the intensity of solar radiation. The series resistance of the generator decreases with the increase in the number of isotype p-p$^+$ junctions in the unit volume of the generator. The current and power sensitivity are also increased owing to the rate of surface recombination decreasing to zero, whereas the range of illumination intensity at which the linear dependence of current and power on illumination is retained, is increased.

Both sides of the generators shown in FIGS. 1 and 5 through 9 are current and voltage sensitive and the both sides, surfaces 3 and 7, can be used as the working surfaces, which feature permits a 30 to 40 percent increase of the output when working on low orbits due to the radiation reflected from the Earth.

The generator having isotype p-p$^+$ junctions on five faces of microphotocells (FIG. 10) features a high efficiency at low intensity of the light flux, from 0.001 to 0.01 Wt/cm², which is from 10 to 100 times less than the intensity of solar radiation, because in this generator the leakage current through the p-n junction is reduced owing to the reduced area and increased depth of the p-n junction, and for the same reason the voltage and power are increased.

The generator according to the present invention can serve as a standard of illumination for solar, laser and thermal radiation in a wide range, from 0.001 to 2000 Wt/cm².

The generator can be used in orientation systems as a coordinate-sensitive element.

While particular embodiments of the present invention have been shown and described in connection with the preferable embodiment thereof, various modifications may be made in the invention without departing from the spirit thereof or the scope of the appended claims, as can be easily appreciated by those skilled in the art.

What is claimed is:

1. A semiconductor photoelectric generator comprising semiconductor photocells each having a doped region, a base region, a metal current lead to said base region; a metal current lead to said doped region; a working surface receiving incident radiation; rectifying barriers, at least one of said rectifying barriers being provided at a distance from said working surface not exceeding the diffusion length of minority current carriers in said base region; isotype p-p$^+$ or n-n$^+$ junctions provided in direct proximity to said working surface; said photocells having the shape of parallelepipeds, at least one linear dimension thereof being commensurate with the diffusion length of minority current carriers in said base region; all said current leads interconnecting said photocells into a generator.

2. A semiconductor photoelectric generator as claimed in claim 1, wherein said rectifying barriers are provided parallel to the surfaces that are opposite to said working surfaces, said current leads being disposed on said working surfaces and on the surfaces that are opposite to said working surfaces; said current leads on the surfaces opposite the working surfaces being arranged over the entire area of said surfaces.

3. A semiconductor photoelectric generator as claimed in claim 2, wherein said rectifying barriers are embodied as p-n junctions; said p-n junctions being disposed at a depth sufficient to eliminate the action of surface effects thereon.

4. A semiconductor photoelectric generator built around semiconductor photocells, each of said photocells comprising; a doped region; a base region; a metal current lead to said base region; a metal current lead to said doped region; a working surface receiving incident radiation; rectifying barriers, at least one of said rectifying barriers being provided at a distance from said working surface not exceeding the diffusion length of minority current carriers to said base region; an isotype p-p$^+$or n-n$^+$ junction provided in direct proximity to said working surface; an additional isotype junction, disposed parallel to the face that is inclined at an angle to said working surface; said photocells having the shape of microminiature parallelepipeds of which at least two linear dimensions are commensurate with the diffusion length of minority current carriers to said base region; all said current leads interconnecting said photocells into a generator.

5. A semiconductor photoelectric generator as claimed in claim 4, wherein said rectifying barriers are disposed parallel to at least one of the faces inclined at an angle to said working surface; each said photoconverters having another additional isotype junction disposed in direct proximity to the surface that is opposite to said working surface.

6. A semiconductor photoelectric generator as claimed in claim 5, wherein said rectifying barriers are embodied as p-n junctions; said p-n junctions being disposed at a depth sufficient for eliminating the influence of surface effects thereon.

7. A semiconductor photoelectric generator as claimed in claim 4, wherein said rectifying barriers are provided parallel to the surfaces which are opposite to the said working surfaces, said current leads are disposed in said working surfaces and on the surfaces that are opposite to said working surfaces; said current leads on the surfaces opposite to the working surfaces being disposed over the entire area of said surfaces.

8. A semiconductor photoelectric generator built around semiconductor photocells, each photocell comprising: a doped region; a base region; a working region which receives incident radiation; a metal current lead to said base region disposed over the entire area of the surface that is opposite to said working surface; a metal current lead to said doped region; rectifying barriers disposed parallel to the faces that are inclined at a certain angle to said working surface; an isotype p—p$^+$ or n—n$^+$ junction disposed in direct proximity to said working surface; an additional isotype junction disposed parallel and in direct proximity to the surface that is opposite the said working surface; said photocells having the shape of microminiature parallelepipeds having at least two linear dimensions commensurate with the diffusion length of minority current carriers in said base region; all said current leads interconnecting said photocells into a generator.

\* \* \* \* \*